(12) United States Patent
Cattoen et al.

(10) Patent No.: US 9,990,448 B2
(45) Date of Patent: Jun. 5, 2018

(54) DATA CENTER FLOOR PLAN MAPPING USING LOCATION-AWARE DEVICE

(71) Applicant: CA, Inc., New York, NY (US)

(72) Inventors: Francois Marie Bruno Cattoen, Newton, MA (US); Janne Mikko Petteri Koponen, Amersham (GB); Dhesikan Ananchaperumal, Shrewsbury, MA (US)

(73) Assignee: CA, Inc., New York, NY (US)

(*) Notice: Subject to any disclaimer, the term of this patent is extended or adjusted under 35 U.S.C. 154(b) by 457 days.

(21) Appl. No.: 14/660,352

(22) Filed: Mar. 17, 2015

(65) Prior Publication Data

US 2016/0275210 A1    Sep. 22, 2016

(51) Int. Cl.
  *G06F 17/50* (2006.01)

(52) U.S. Cl.
  CPC ............... *G06F 17/5004* (2013.01)

(58) Field of Classification Search
  CPC .................................. G06F 17/5004
  USPC ................................................ 703/1
  See application file for complete search history.

(56) References Cited

U.S. PATENT DOCUMENTS

| | | | |
|---|---|---|---|
| 6,205,380 B1 | 3/2001 | Bauer et al. | |
| 7,584,020 B2 | 9/2009 | Bruemmer et al. | |
| 7,726,144 B2 * | 6/2010 | Larson | G05D 23/1931 165/104.33 |
| 7,756,667 B2 * | 7/2010 | Hamann | G01K 1/026 374/141 |
| 8,126,722 B2 * | 2/2012 | Robb | G06Q 30/04 705/1.1 |
| 8,340,818 B2 | 12/2012 | Pitzer | |
| 8,340,852 B2 | 12/2012 | Bageshwar et al. | |
| 8,639,482 B2 * | 1/2014 | Rasmussen | G06F 1/20 703/5 |
| 8,803,660 B2 * | 8/2014 | Martin | G08C 21/00 340/10.1 |
| 8,812,275 B2 * | 8/2014 | Archibald | H05K 7/20745 703/1 |
| 9,116,818 B2 * | 8/2015 | Bilange | G06F 12/0866 |
| 9,858,482 B2 * | 1/2018 | Perez | G06K 9/00671 |
| 2005/0186972 A1 | 8/2005 | Ogino et al. | |
| 2012/0026322 A1 | 2/2012 | Malka et al. | |

OTHER PUBLICATIONS

Shodan-Computer search engine, printed from the internet on Mar. 17, 2015 at URL https://www.slideshare.net/slideshow/embed_code/45733940 http://www.shodanhq.com/help/filters.

(Continued)

*Primary Examiner* — Juan Ochoa
(74) *Attorney, Agent, or Firm* — Sage Patent Group

(57) ABSTRACT

A method includes performing operations as follows on a processor: receiving a geographic reference signal, generating location information responsive to the geographic reference signal, defining a portion of a floor surface area of a data center based on the location information, specifying a usage status of the portion of the floor surface area of the data center, and updating a floor plan of the data center based on the usage status of the portion of the floor surface area.

16 Claims, 8 Drawing Sheets

(56) References Cited

OTHER PUBLICATIONS

Grant, Rebecca, "MagicPlan Captures and Maps Your Home With a Smartphone", Mar. 12, 2013, p. 1-6, printed from the internet on Mar. 17, 2015 at URL https://www.slideshare.net/slideshow/embed_code/45733940 http://venturebeat.com/2013/03/12/magicplan-captures-and-maps-your-home-with-a-smartphone/.

Hardy, Quentin, "Mapping Our Interiors", The New York Times, May 18, 2014, p. 1-3, printed from the internet on Mar. 17, 2015 at URL http://bits.blogs.nytimes.com/2014/05/18/mapping-our-interiors/?_r=1.

\* cited by examiner

DATA CENTER FLOOR PLAN MAPPING USING LOCATION-AWARE DEVICE

BACKGROUND

The present disclosure relates management of data centers, and in particular to methods, systems, and computer program products for managing the surface area occupied by a data center Large Information Technology (IT) environments may include a variety of elements. For example, a data center may include data center equipment such as servers, network storage devices, computing devices, network routers, network gateways, wireless/wired network interface devices, etc that are arranged in one or more rooms or floors. Moreover, the data center may include a large quantity of a particular type of IT element. As an example, the data center may include a large quantity of servers. Each of the servers may be associated with multiple identifiers, such as a name, a number, and an address. Data centers may also include undocumented/unidentified elements, such as furniture, storage cabinets, appliances (e.g., portable heaters, fans, refrigerators), and the like.

SUMMARY

In some embodiments of the inventive subject matter, a method comprises performing operations as follows on a processor: receiving a geographic reference signal, generating location information responsive to the geographic reference signal, defining a portion of a floor surface area of a data center based on the location information, specifying a usage status of the portion of the floor surface area of the data center, and updating a floor plan of the data center based on the usage status of the portion of the floor surface area.

In other embodiments of the inventive subject matter, a system comprises a processor and a memory coupled to the processor, which comprises computer readable program code embodied in the memory that when executed by the processor causes the processor to perform operations comprising: receiving a geographic reference signal, generating location information responsive to the geographic reference signal, defining a portion of a floor surface area of a data center based on the location information, specifying a usage status of the portion of the floor surface area of the data center, and updating a floor plan of the data center based on the usage status of the portion of the floor surface area.

In still other embodiments of the inventive subject matter, a computer program product comprises a tangible computer readable storage medium comprising computer readable program code embodied in the medium that when executed by a processor causes the processor to perform operations comprising: receiving a geographic reference signal, generating location information responsive to the geographic reference signal, defining a portion of a floor surface area of a data center based on the location information, specifying a usage status of the portion of the floor surface area of the data center, and updating a floor plan of the data center based on the usage status of the portion of the floor surface area.

It is noted that aspects described with respect to one embodiment may be incorporated in different embodiments although not specifically described relative thereto. That is, all embodiments and/or features of any embodiments can be combined in any way and/or combination. Moreover, other methods, systems, articles of manufacture, and/or computer program products according to embodiments of the inventive subject matter will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims. It is further intended that all embodiments disclosed herein can be implemented separately or combined in any way and/or combination.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1A:
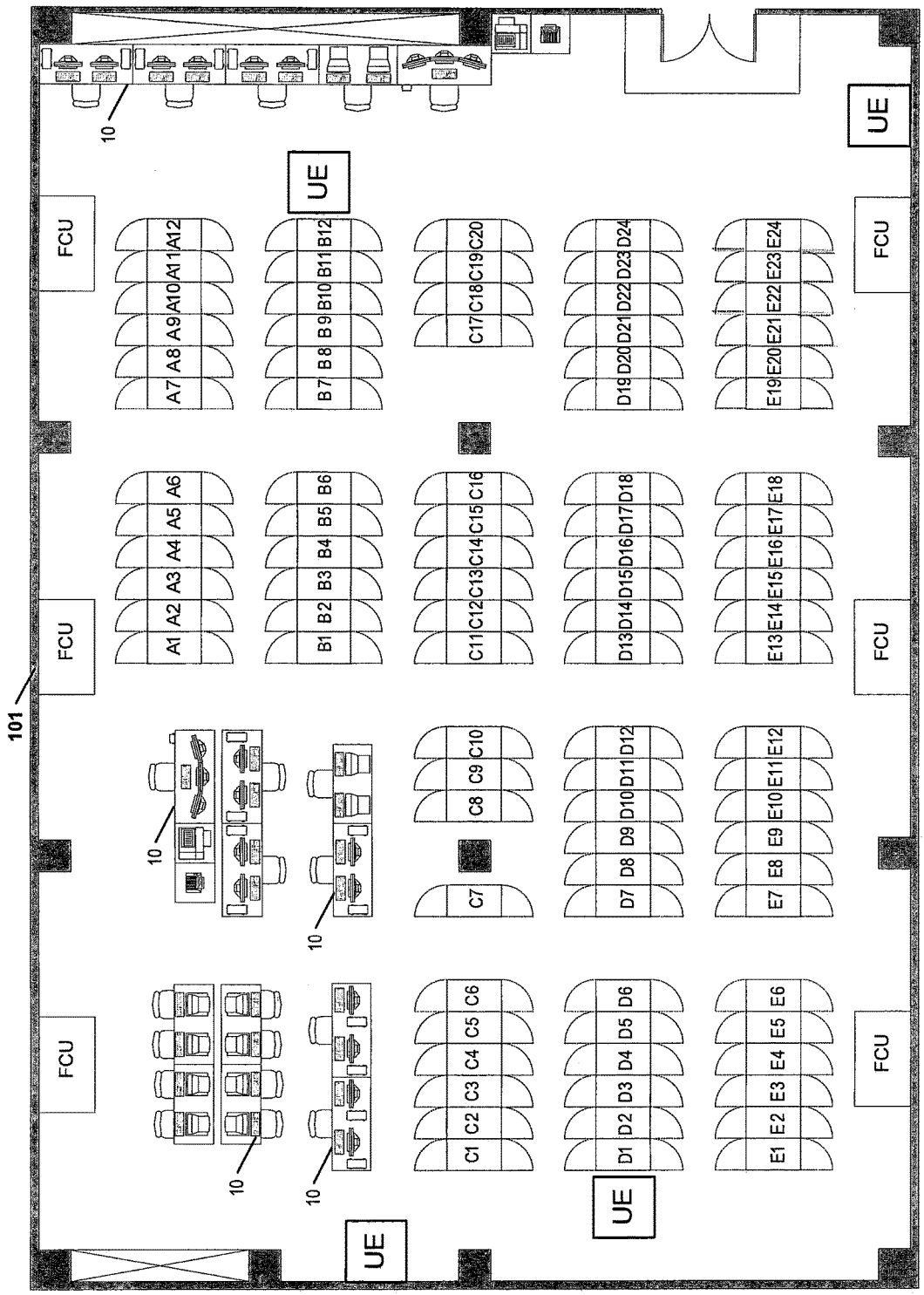
FIG. 1A is a schematic plan view of a floor plan of a data center in accordance with some embodiments of the inventive subject matter.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, a "service" includes, but is not limited to, a software and/or hardware service, such as cloud services in which software, platforms, and infrastructure are provided remotely through, for example, the Internet. A service may be provided using Software as a Service (SaaS), Platform as a Service (PaaS), and/or Infrastructure as a Service (IaaS) delivery models. In the SaaS model, customers generally access software residing in the cloud using a thin client, such as a browser, for example. In the PaaS model, the customer typically creates and deploys the software in the cloud sometimes using tools, libraries, and routines provided through the cloud service provider. The cloud service provider may provide the network, servers, storage, and other tools used to host the customer's application(s). In the IaaS model, the cloud service provider provides physical and/or virtual machines along with hypervisor(s). The customer installs operating system images along with application software on the physical and/or virtual infrastructure provided by the cloud service provider.

As used herein, the term "data processing facility" includes, but it not limited to, a hardware element, firmware component, and/or software component. A data processing system may be configured with one or more data processing facilities.

As used herein, the term "mobile terminal" or "mobile device" may include a satellite or cellular radiotelephone with or without a multi-line display; a Personal Communications System (PCS) terminal that may combine a cellular radiotelephone with data processing, facsimile and data communications capabilities; a PDA or smart phone that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals or mobile devices may also be referred to as "pervasive computing" devices.

As used herein, data are raw, unorganized facts that need to be processed. Data can be something simple and seemingly random and useless until it is organized. When data are processed, organized, structured or presented in a given context so as to make it useful, it is called content or information. Examples of content or information include, but are not limited to, word processing files, slide presentation program files, spreadsheet files, video files, audio files, picture files, and document exchange files.

As demand for higher-speed data communication increases, data centers are proliferating around the world. Data centers may include a multitude of data center elements, such as servers, power supplies, routers, firewalls, and the like. As an example, a data center may include thousands of such elements housed in a single physical facility. The elements may generally be arranged in racks, which themselves may be arranged in aisles of the data center. These elements may be physically moved, removed from service upon fault detection, and/or temporarily taken out of service for maintenance. Data center operators may desire to know information, such as location and attributes, about all of the data center elements in the data center to improve performance of the overall data center. Some embodiments of the inventive subject matter stem from a realization that a data center operator may have a desire for up to date information about how the surface area of a data center floor is being used. The data center floor may include racks of electronic equipment that may be labeled with identifiers for maintaining an inventory of these elements. The data center floor may also, however, include unlabeled elements that may not be part of the data center inventory. For example, the data center may include unlabeled elements, such as furniture, storage cabinets, appliances (e.g., portable heaters, fans, refrigerators), and the like. The data center may also include portions of the floor surface area that are currently vacant. The data center operator may use an accurate assessment of how the surface area of a data center floor is being used to determine how to allocate space for new equipment, determine how to improve space utilization for existing equipment, and determine how to prioritize the use of space, e.g., move or de-allocate furniture being used for a coffee station to make room for new customer equipment. Some embodiments of the present invention provide a location-aware device that can be used to receive a geographic reference signal and to generate location information therefrom. A user may use the location information as a basis for defining a portion of the floor surface area of the data center. For example, a user may traverse a data center floor with the location-aware device to generate location information that corresponds to a perimeter of the portion of data center floor surface area that is being defined. In other embodiments, the user may collect a locus of points of location information inside and/or outside the boundary or perimeter of the portion of data center floor surface area. These points of location information points may be used to define the boundary or perimeter of the portion of the data center floor surface area. A usage status may be specified for the portion of the data center floor, which, in some embodiments of the inventive subject matter, may indicate whether the portion is empty or occupied. If occupied, the usage status may specify whether the portion is occupied with a labeled or unlabeled element. The floor plan of the data center may be updated based on the usage status specification of the portion of the data center floor surface area. A data center administrator may, for example, use the usage status specification to reserve the portion of the data center floor surface area for a new element, to reconfigure the elements on the data center floor to more efficiently use the available space, and/or to confirm that the floor plan accurately reflects the configuration of elements that currently reside in the data center.

For ease of discussion, a non-limiting, ongoing example of a data center including data center elements is discussed herein. The embodiments described, however, may be applied to other physical spaces, such as, for example, a rental car parking lot including automobiles, a grocery store or retail store including shelves of items for purchase, a home, business, or any other structure containing furniture or other items, or any other physical environment where a large number of physical objects/components are present and it is desirable to manage the surface area where the physical objects/components are placed.

FIG. 1A is a schematic plan view of a floor plan of a data center in accordance with some embodiments of the inventive subject matter. The data center 101 can include hundreds or thousands of elements, such as data servers, also referred to as computing resources, which are mounted to physical racks within cabinets. The example data center 101 includes cabinets (also commonly referred to as "racks") A1-12, B1-12, C1-20, D1-24, and E1-24 arranged in rows and columns for accessibility by operators. Each cabinet contains physical storage spaces (e.g., mounting spaces on rack(s), use/unit spaces "U-spaces", etc.) where data servers and other resources can be installed to host guest virtual machines and/or applications, as described further below. Facilities Control Units (FCU) have electrical power sources (e.g., power conditioning and backup power sources), cooling devices, and other equipment that supports operation of resources in the cabinets. Each cabinet can include a local electrical power supply device(s) and a cooling device(s) that cools resources mounted in the cabinet.

The data servers can consume substantial amounts of electrical power, occupy significant amounts of physical rack storage space and floor space, and require substantial cooling heat transfer to remain within an acceptable operational temperature range. The electrical power, physical rack storage space and floor space, cooling, and other support systems are examples of infrastructure resources provided by the data center 101 to support operation of the data servers.

In accordance with some embodiments of the inventive subject matter, a plurality of operator work stations 10 are illustrated as having computer processing and display devices for use by operators to monitor and control operation of the data center 101.

Each cabinet in the data center 101 may include data network interfaces, also referred to as network resources, that communicatively interconnect resources in the cabinets. The data servers may perform computer operations that provide a plurality of guest Virtual Machines (VMs) within a plurality of VM clusters. Each VM cluster can include a plurality of guest VMs, and each VM cluster can reside on different data servers or may be distributed across more than one data server.

In some embodiments of the inventive subject matter, an operator can take a digital photograph of a rack containing physical resource elements, such as servers, power supplies, and networking equipment. Each of these physical resource elements may be labeled so as to have one or more identifiers thereon. For example, different identifiers on a physical resource element may correspond to an asset number in an asset management system, an Internet Protocol (IP) address in a network management system, and a name in an application management system, respectively. Accordingly, image processing can be performed to identify the plurality of identifiers on the physical resource element and to link the identifiers to each other, thus providing identity reconciliation for the physical resource component. Moreover, in some embodiments, the image processing operations may be repeated for a plurality of the physical resource elements, thus providing identity reconciliation for the plurality (e.g., for all, or for a subset) of the physical resource components in the digital photograph. Thus, these identifiers may be useful for maintaining an inventory of the physical resource elements in the data center 101.

The data center 101 may also include unlabeled elements (UE), such as furniture, storage cabinets, appliances (e.g., portable heaters, fans, refrigerators), the operator work stations 10, and the like. These unlabeled elements (UEs) do not have the identifiers disposed thereon for maintaining an inventory of the elements in the data center 101.

Figure 1B:
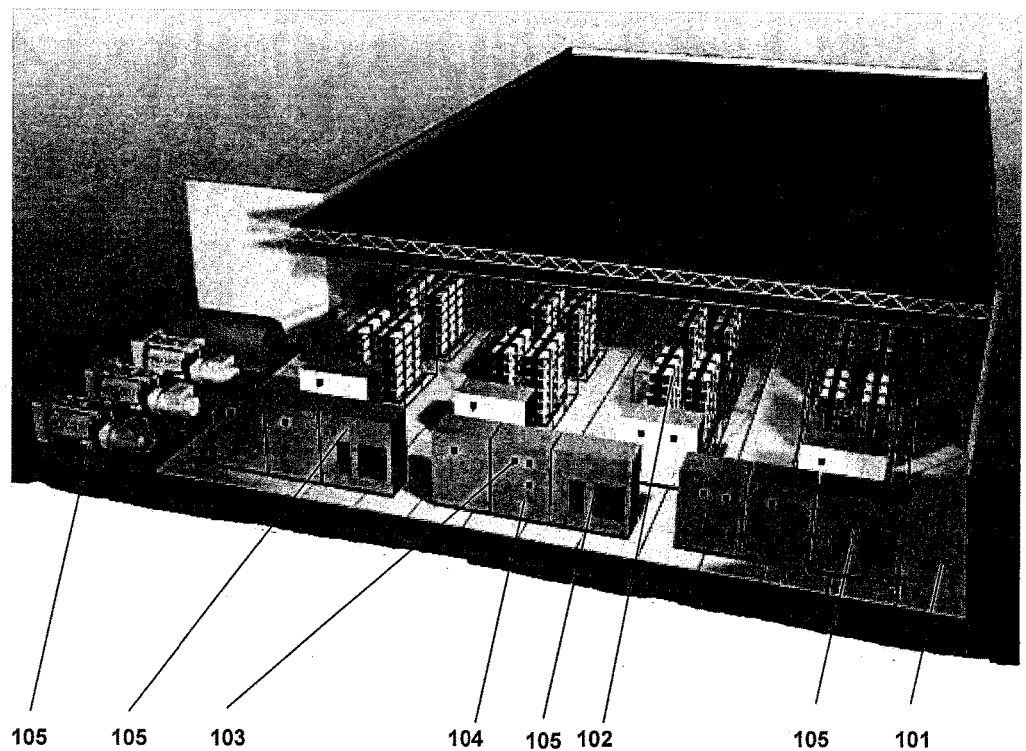
FIG. 1B is a perspective view of a floor plan of the data center in accordance with some embodiments of the inventive subject matter.

FIG. 1B is a perspective view of a floor plan of the data center 101 in accordance with some embodiments of the inventive subject matter. The data center 101 may be a facility to house elements, such as computer systems and/or associated physical objects, as described with respect to FIG. 1A. The data center 101 may include data center equipment, such as communications equipment 102 including data networking equipment, telecommunications equipment, storage systems, servers, routers, gateways, and/or equipment racks arranged in aisles, rows, and/or stacked in columns. Data center equipment may include supporting equipment 104, such as power supplies, connectors, wiring, environmental controls, such as Heating, Ventilating, and Air-Conditioning (HVAC), fire suppression equipment, and/or various security devices. Some elements of the data center equipment 102 and/or 104 may include a coded reference identifier 103 while some elements 105 of the supporting equipment 104, for example, do not have a coded reference identifier.

Figure 1C:
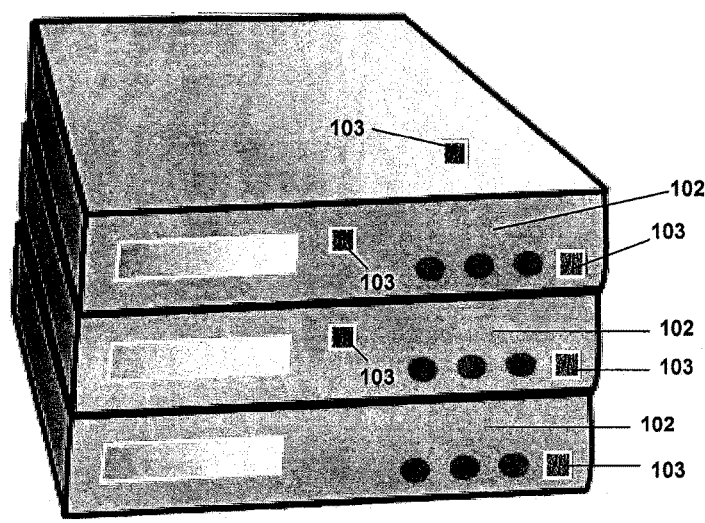
FIG. 1C is a perspective view of labeled elements from the data center in accordance with some embodiments of the inventive subject matter.

FIG. 1C is a perspective view of labeled elements from the data center 101 in accordance with some embodiments of the inventive subject matter. A plurality of data center equipment elements 102 and/or 104 may be located in the data center 101, specifically in a given rack number of a given aisle number of the data center 101. Each of the plurality of data center equipment elements 102 and/or 104 may include one or more coded reference identifiers 103 affixed thereto (or otherwise provided thereon).

Figure 1D:
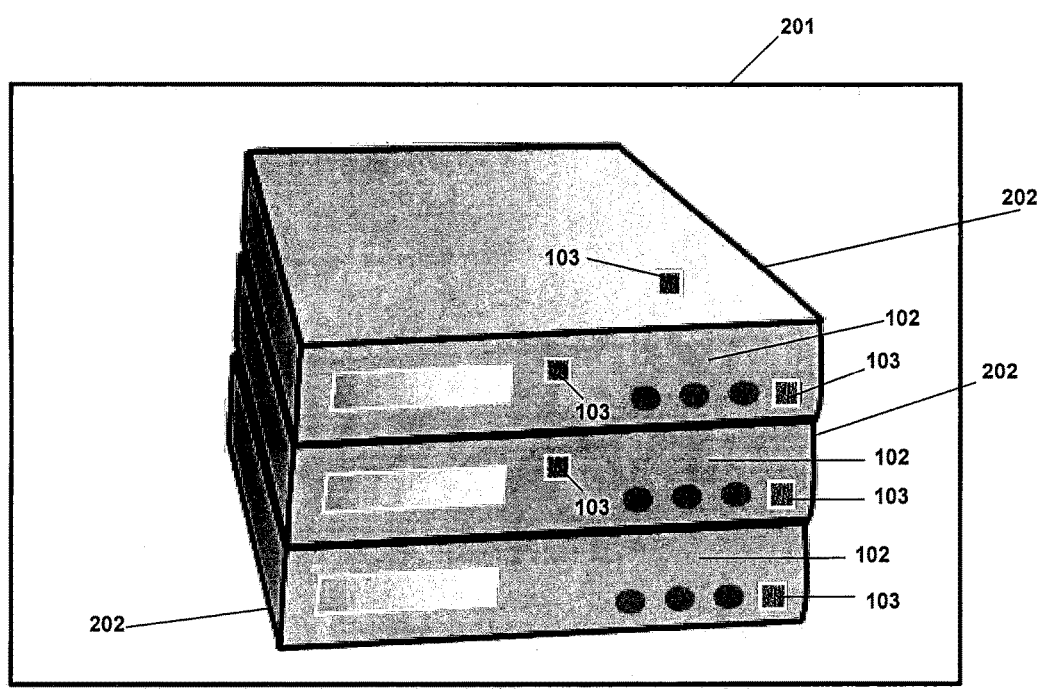
FIG. 1D illustrates a digital image of the labeled elements of FIG. 1C in accordance with some embodiments of the inventive subject matter.

FIG. 1D illustrates a digital image of the labeled elements of FIG. 1C in accordance with some embodiments of the inventive subject matter. The digital image 201 may include images of the plurality of data center equipment elements 102 and/or 104. Specifically, the digital image 201 includes an image of the coded reference identifiers 103 that are affixed to (or otherwise provided on) the plurality of data center equipment elements 102 and/or 104. Moreover, each of the plurality of data center equipment elements 102 and/or 104 may have a boundary 202. A particular boundary 202 of a particular physical element (e.g., a particular data center equipment element 102 or 104) may assume any shape of the physical object and may demarcate an area in the digital image 201 that represents the physical object. The boundary 202 may be determined for a two-dimensional and/or perspective view of the digital image 201. A coded reference identifier 103 contained within the boundary 202 of the physical object may be a Quick Response Code (QR code), a barcode, a Universal Product Code (UPC) symbol, and/or any other machine-optically-recognizable coding identifier including a reference to the physical object in accordance with various embodiments of the inventive subject matter. The coded reference identifier 103 may be optically recognized, according to some embodiments of the inventive subject matter, by applying various image processing and/or image search algorithms. Image processing may include any form of signal processing for which the input is an image, such as a photograph or video frame. The output of image processing may be either an image and/or a set of characteristics or parameters related to the image. Image processing may refer to digital image processing, optical image processing, and/or analog image processing.

Figure 2:
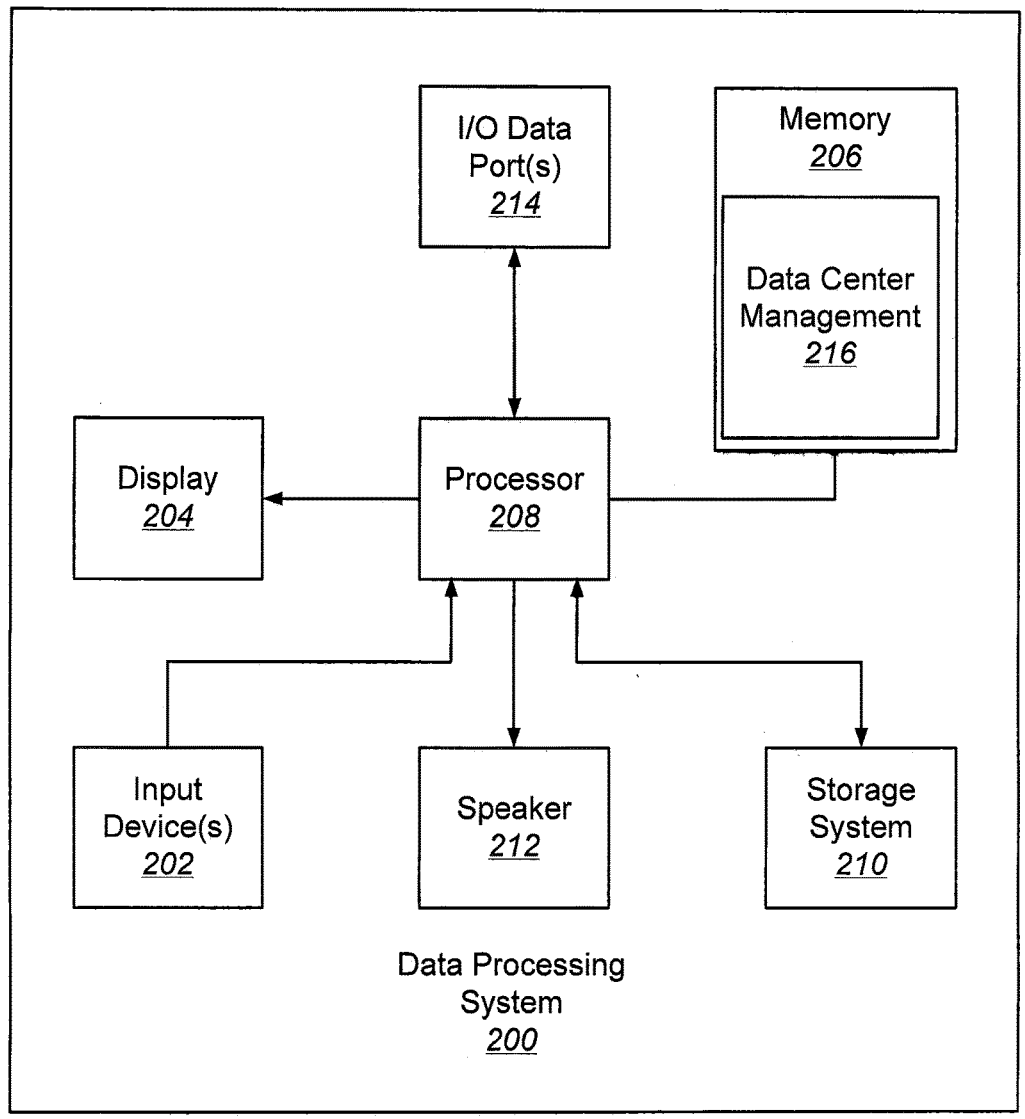
FIG. 2 is a block diagram that illustrates a data processing system to facilitate data center floor plan mapping using a location aware-device in accordance with some embodiments of the inventive subject matter.

FIG. 2 is a block diagram that illustrates a data processing system to facilitate data center floor plan mapping using a location aware-device in accordance with some embodiments of the inventive subject matter. Referring now to FIG. 2, a data processing system 200, in accordance with some embodiments of the inventive subject matter, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, flash drives, USB drives, hard disks, or the like, as well as virtual storage, such as a RAMDISK or cloud storage. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with a data center management module 216 that that my provide functionality that includes, but is not limited to, managing the inventory of labeled and unlabeled elements in the data center 101, managing a floor plan of the data center 101 including how the surface area of the data center floor is allocated, managing resource usage in the data center 101, e.g., processor utilization, memory utilization, and the like, managing power consumption in the data center 101, and/or managing network traffic into and out of the data center 101.

Figure 3:
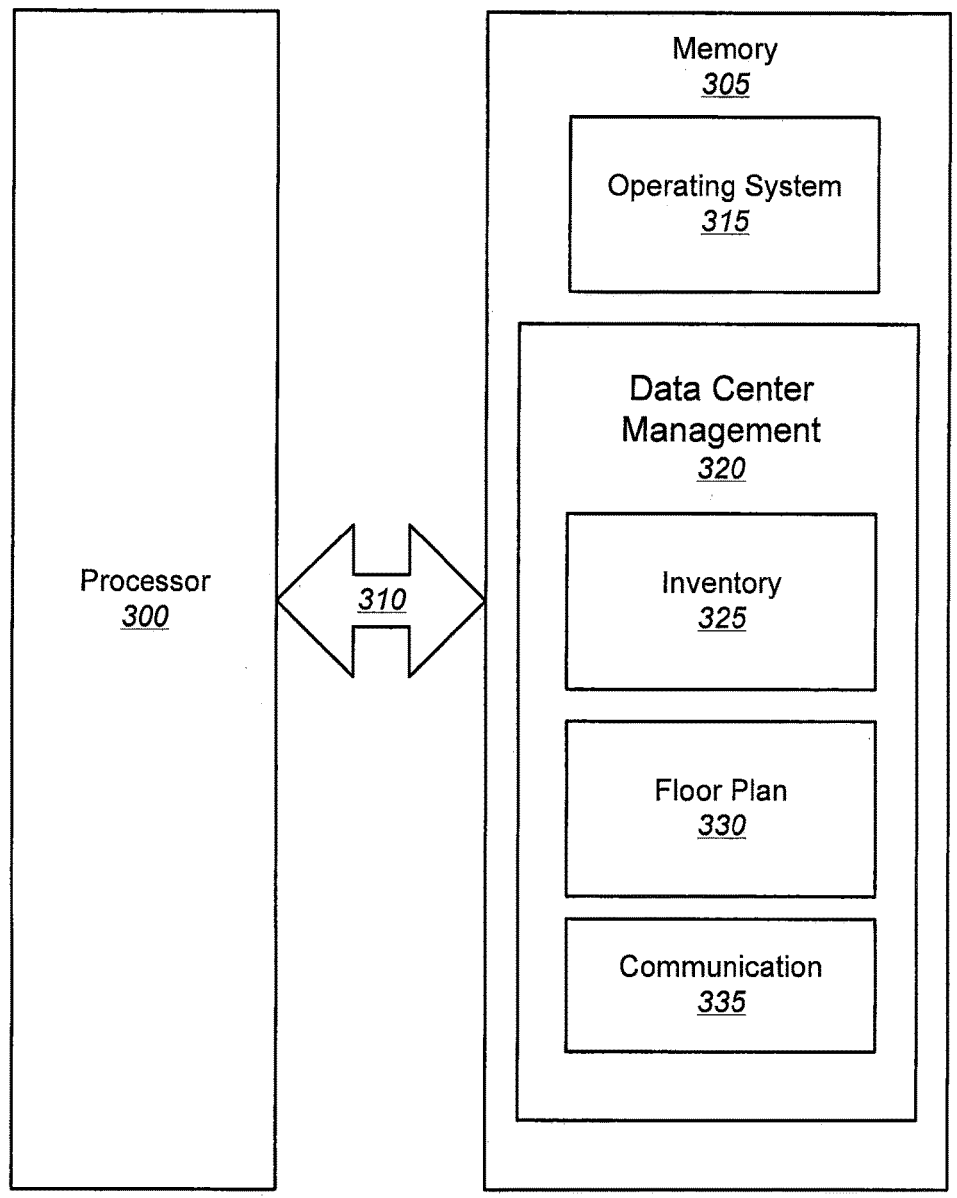
FIG. 3 is a block diagram that illustrates a software/hardware architecture for the data processing system of FIG. 2 in accordance with some embodiments of the inventive subject matter.

FIG. 3 illustrates a processor 300 and memory 305 that may be used in embodiments of data processing systems, such as the data processing system 200 of FIG. 2, respectively, for facilitating data center floor plan mapping using a location aware-device according to some embodiments of the inventive subject matter. The processor 300 communicates with the memory 305 via an address/data bus 310. The processor 300 may be, for example, a commercially available or custom microprocessor. The memory 305 is representative of the one or more memory devices containing the software and data used for facilitating data center floor plan mapping using a location aware-device in accordance with some embodiments of the inventive subject matter. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and a data center management module 320. In particular, the operating system 315 may manage the data processing system's software and/or hardware resources and may coordinate execution of programs by the processor 300. The data center management module 320 may comprise an inventory module 325, a floor plan module 330, and a communication module 335. The inventory module 325 may be configured to maintain records of elements in a data center. As described above, these elements may include labeled items, such as servers, power supplies, routers, firewalls, and the like and/or unlabeled elements, such as furniture, storage cabinets, appliances (e.g., portable heaters, fans, refrigerators), operator work stations, and the like. Various descriptors may be used to identify the labeled and/or unlabeled items including, but not limited to, an asset number in an asset management system, an IP address in a network management system, and/or a name in an application management system.

The floor plan module 330 may be configured to track the positional layout of the various elements in the data center by way of a floor plan. The floor plan may provide an indication of where various elements are located within the data center, how much space the elements occupy, the type or identity of the element occupying the space, and/or an indication that certain space is vacant. The floor plan module 330 may also cross reference the elements in the floor plan with one or more inventory data structures and/or databases managed through the inventory module 325. In some embodiments, the floor plan module 330 may update the floor plan of the data center based on the usage status specification of the portion of the data center floor surface area. A data center administrator may, for example, use the usage status specification to reserve the portion of the data center floor surface area for a new element, to reconfigure the elements on the data center floor to more efficiently use the available space, and/or to confirm that the floor plan accurately reflects the configuration of elements that currently reside in the data center.

The communication module 335 may be configured to facilitate communication between the data processing system 200 and other entities, such as a location-aware electronic device/mobile terminal.

Although FIG. 3 illustrates hardware/software architectures that may be used in data processing systems, such as the data processing system 200 of FIG. 2 for facilitating data center floor plan mapping using a location aware-device according to some embodiments of the inventive subject matter, it will be understood that the present invention is not limited to such a configuration but is intended to encompass any configuration capable of carrying out operations described herein.

Figure 4:
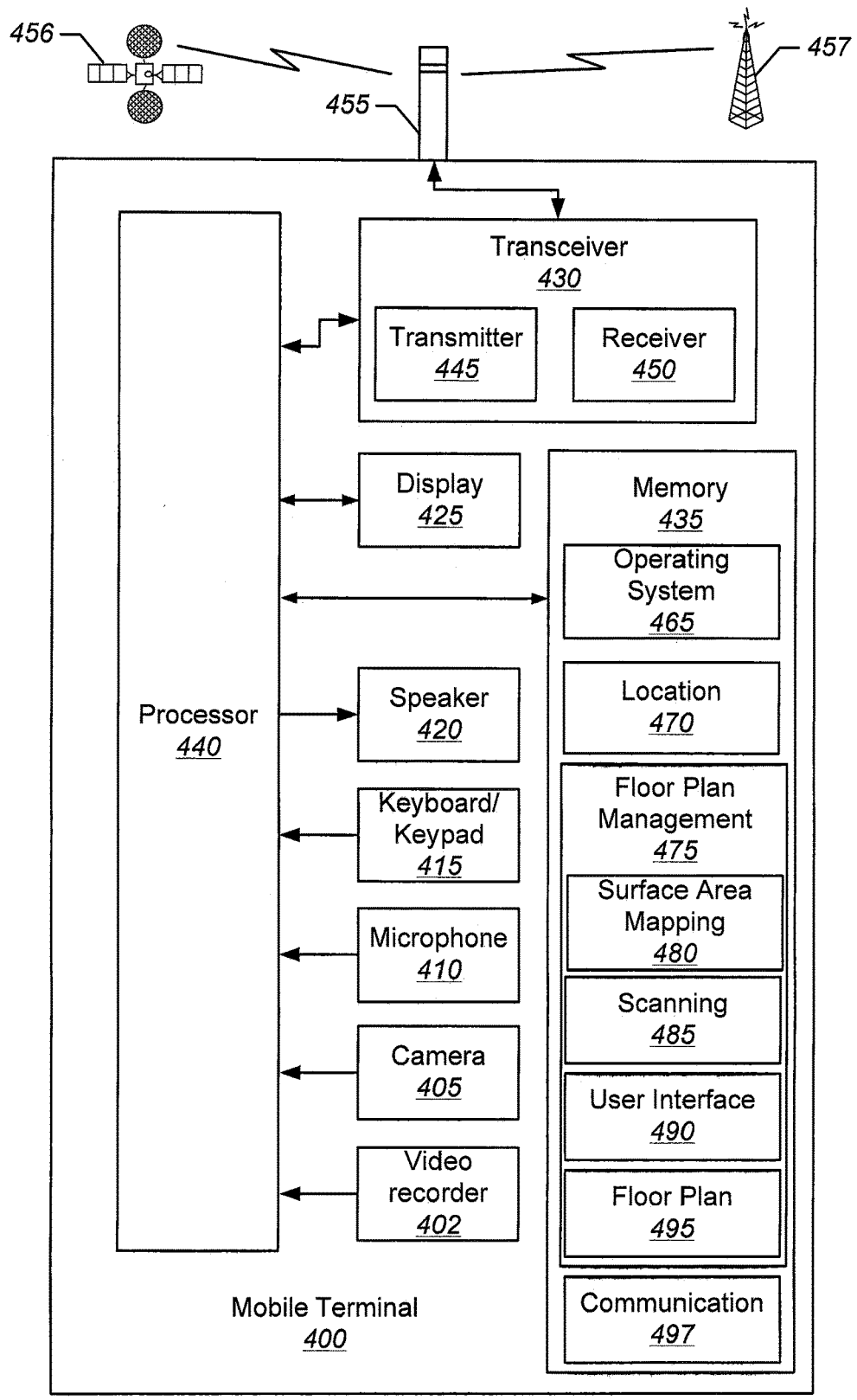
FIG. 4 is a block diagram that illustrates a location-aware electronic device/mobile terminal to facilitate data center floor plan mapping in accordance with some embodiments of the inventive subject matter.

FIG. 4 is a block diagram that illustrates a location-aware electronic device/mobile terminal to facilitate data center floor plan mapping in accordance with some embodiments of the inventive subject matter. In accordance with some embodiments of the inventive subject matter, the mobile terminal 400 includes a video recorder 402, a camera 405, a microphone 410, a keyboard/keypad 415, a speaker 420, a display 425, a transceiver 430, and a memory 435 that communicate with a processor 440. The transceiver 430 comprises a transmitter circuit 445 and a receiver circuit 450, which respectively transmit outgoing radio frequency signals to base station transceivers and receive incoming radio frequency signals from the base station transceivers via an antenna 455. The radio frequency signals transmitted between the mobile terminal 400 and the base station transceivers may comprise both traffic and control signals (e.g., paging signals/messages for incoming calls), which are used to establish and maintain communication with another party or destination. The radio frequency signals may also comprise packet data information, such as, for example, cellular digital packet data (CDPD) information. The foregoing components of the mobile terminal 400 may be included in many conventional mobile terminals and their functionality is generally known to those skilled in the art.

The processor 440 communicates with the memory 435 via an address/data bus. The processor 440 may be, for example, a commercially available or custom microprocessor. The memory 435 is representative of the one or more memory devices containing the software and data used to facilitate data center floor plan mapping in accordance with some embodiments of the inventive subject matter. The memory 435 may include, but is not limited to, the following types of devices: cache, ROM, PROM, EPROM, EEPROM, flash, SRAM, and DRAM.

As shown in FIG. 4, the memory 435 may contain three or more categories of software and/or data: an operating system 465, a location module 470, and a floor plan management module 475. The operating system 465 generally controls the operation of the mobile terminal 400. In particular, the operating system 465 may manage the mobile terminal's software and/or hardware resources and may coordinate execution of programs by the processor 440.

The location module 470 may include a navigation application that is configured to receive location information, such as position data, from the receiver circuit. For example, the receiver 450 may comprise circuitry to receive local positioning system signals from base stations 457, such as cellular and/or Wi-Fi signals, and/or global satellite system signals from satellites 456, such as Global Positioning System (GPS) signals. While various embodiments of the invention are described herein with reference to GPS satellites, it will be appreciated that the embodiments are applicable to any navigation system including, but not limited to, positioning systems that utilize pseudolites or a combination of satellites and pseudolites. Pseudolites are ground-based transmitters that broadcast a signal similar to a traditional satellite-sourced GPS signal modulated on an L-band carrier signal, generally synchronized with GPS time. The term "satellite," as used herein, is intended to include pseudolites or equivalents of pseudolites, and the term GPS signals, as used herein, is intended to include GPS-like signals from pseudolites or equivalents of pseudolites. Also, while the following discussion references the United States GPS system, various embodiments herein can be applicable to similar satellite positioning systems, such as the Global Navigation Satellite System (GLONASS), GALILEO satellite system and/or BeiDou Navigation Satellite System (BDNSS).

The floor plan management module 475 may comprise four or more modules: a surface area mapping module 480, a scanning module 485, a user interface module 490, and a floor plan module 495. The surface area mapping module 480 may be configured to receive the location information from the location module 470 and to define a portion of a floor surface area of the data center based on the location information. For example, in some embodiments, a user may traverse a perimeter of a portion of the data center floor surface area such that the location information received from the location module 470 corresponds to the perimeter or outline of the portion of the data center floor surface area that is being defined. In other embodiments, the location information may map to various points internal to a region of the portion of the data center floor surface area being defined. The surface area mapping module 480 may take the locus of internal points to define boundaries the data center floor surface area portion. Similarly, the location information may map to various points external to a region of the portion of the data center floor surface area being defined. For example, one or more data center elements may occupy a space and a user of the mobile terminal may traverse the perimeter of these elements as described above or may gather a collection of location information data points around an exterior region of the portion of the data center floor surface area that is occupied and is to be defined. The surface area mapping module 480 may take the locus of external points to define boundaries the data center floor surface area portion.

The scanning module 485 may be configured to recognize and identify the labeled elements in the data center based on their coded reference identifiers as described above. The scanning module 485 may identify labeled elements directly through their QR code, barcode, UPS symbol, or the like, for example, or may process a digital image of such identifiers by applying one or more image processing and/or image search techniques. Information obtained regarding the presence of one or more labeled elements may be shared with inventory management data structures and/or databases.

The user interface module 490 may be configured to allow the user of the mobile terminal 400 to interact with the location module 470, for example, to turn on and turn off the location module 470 at appropriate times when it is desired to collect location information inside the data center. For example, when traversing a perimeter of a portion of the data center floor surface area to be defined the user may active the location module 470 at the start of the path and deactivate the location module 470 at the end of the path once the perimeter has been traversed. The user interface 490 may also be used to specify a usage status of the portion of the data center floor surface area that has been defined. For example, the user may specify that the defined portion of the data center floor surface area is vacant and/or occupied with one or more labeled and/or unlabeled elements. Details regarding the labeled elements occupying a portion of the data center floor surface area may be obtained through the scanning module 485. Information obtained regarding the presence of one or more labeled and/or unlabeled elements may be shared with inventory management data structures and/or databases.

The floor plan module 495 may be configured to manage the floor plan of the data center and track how the floor surface area of the data center is used. The floor plan module 495 may be analogous to the floor plan module 330 that may be used in the data processing system 200 of FIG. 2. Thus, the floor plan module 495 may be configured to track the positional layout of the various elements in the data center by way of the floor plan. The floor plan may provide an indication of where various elements are located within the data center, how much space the elements occupy, the type or identity of the element occupying the space, and/or an indication that certain space is vacant. The floor plan module 495 may also cross reference the elements in the floor plan with one or more inventory data structures and/or databases. In some embodiments, the floor plan module 495 may update the floor plan of the data center based on the usage status specification of the portion of the data center floor surface area. A data center administrator may, for example, use the usage status specification to reserve the portion of the data center floor surface area for a new element, to reconfigure the elements on the data center floor to more efficiently use the available space, and/or to confirm that the floor plan accurately reflects the configuration of elements that currently reside in the data center. The floor plan may be maintained on the mobile terminal 400 and/or the data processing system 200.

The communication module 497 may be configured to facilitate communication between the mobile terminal 400 and other entities, such as the data processing system 200 to share data center floor plan and/or element inventory information therebetween.

Although FIG. 4 illustrates an exemplary software and hardware architecture that may be used for facilitating data center floor plan mapping according to some embodiments of the inventive subject matter, it will be understood that embodiments of the present invention are not limited to such a configuration, but are intended to encompass any configuration capable of carrying out the operations described herein.

Computer program code for carrying out operations of data processing systems discussed above with respect to FIGS. 2-4 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the data processing system 200 of FIG. 2, hardware/software architecture of FIG. 3, and mobile device 400 of FIG. 4 may each be implemented as a single processor system, a multi-processor system, a multi-core processor system, or even a network of stand-alone computer systems, in accordance with various embodiments of the inventive subject matter. Each of these processor/computer systems may be referred to as a "processor" or "data processing system."

The data processing apparatus of FIGS. 2-4 may be used to facilitate data center floor plan mapping according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be stand-alone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208, memory 305 coupled to the processor 300, and memory 435 coupled to the processor 440 include computer readable program code that, when executed by the respective processors, causes the respective processors to perform operations including one or more of the operations described herein with respect to FIGS. 5 and 6.

Figure 5:
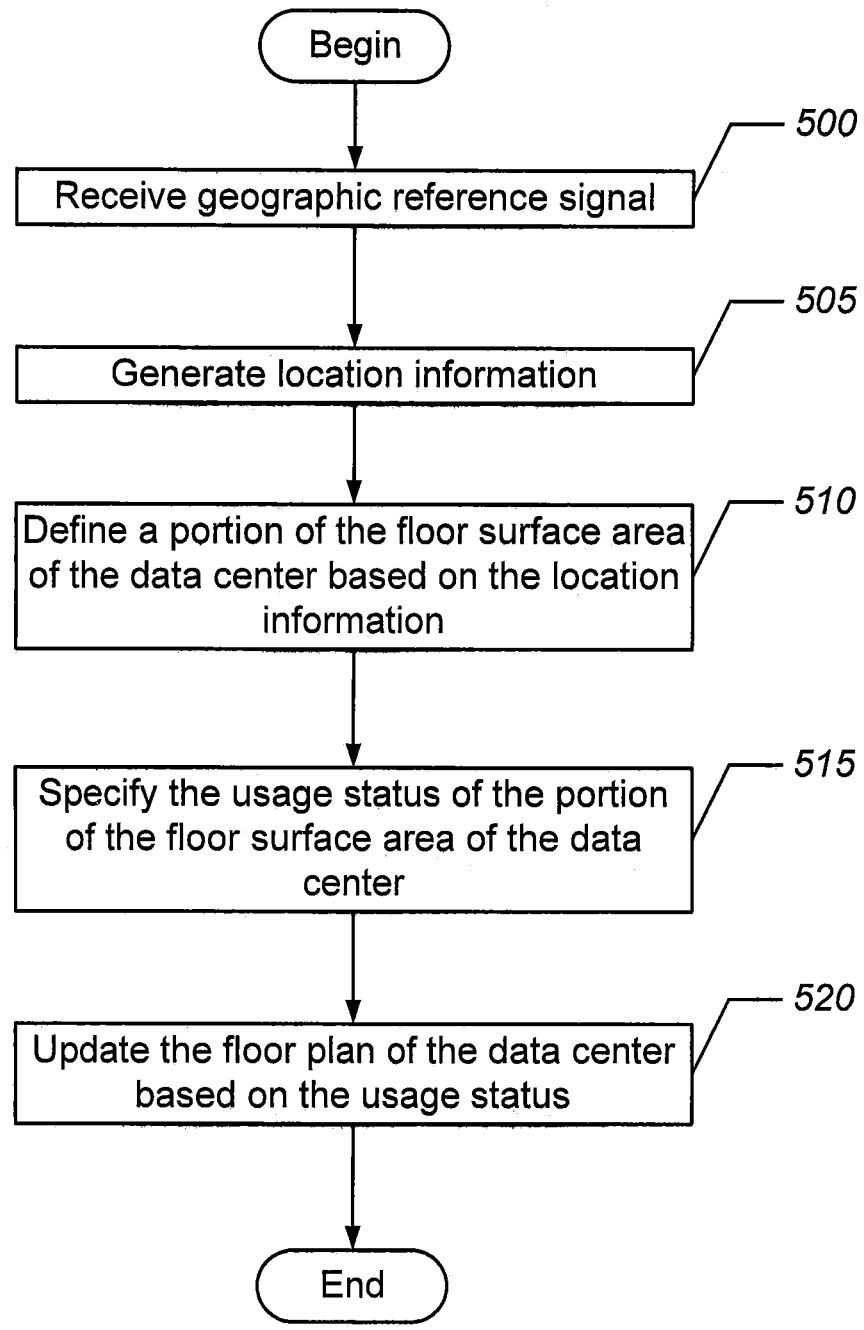
FIGS. 5 and 6 are flow charts that illustrate operations for facilitating data center floor plan mapping using a location-aware device in accordance with some embodiments of the inventive subject matter.
Figure 6:
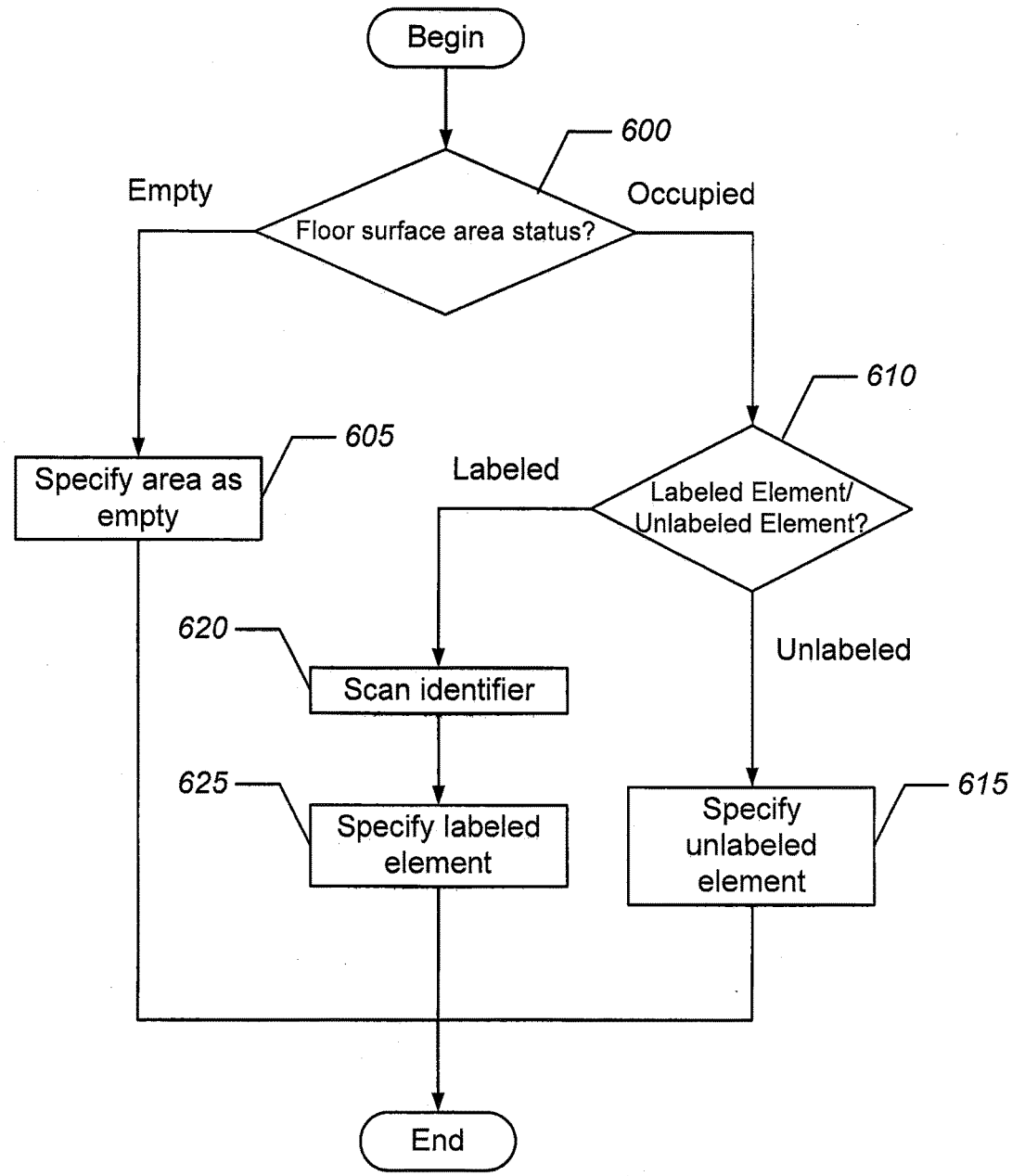

FIGS. 5 and 6 are flow charts that illustrate operations for facilitating data center floor plan mapping using a location-aware device in accordance with some embodiments of the inventive subject matter. Referring to FIG. 5, operations begin at block 500 where the mobile terminal 400 receives a geographic reference signal, such as a local positioning system signal and/or a global satellite system signal. Location information may be generated at block 505 by, for example, traversing a path along a perimeter of a surface area of the data center floor, collecting various location information that maps to an internal region of the surface area of the data center floor, and/or collecting various location information that maps to an external region of the surface area of the data center floor. At block 510, the location information is used to define the portion of the floor surface area of the data center floor. As described above, the definition may be based on the location information corresponding to the perimeter of the floor surface area that is being defined, which may be obtained by the mobile terminal 400 tracing a path along the perimeter while collecting the location information. In other embodiments, a locus of points may be collected in an internal region of the portion of the data center floor surface area and/or in an external region of the portion of the data center floor surface area and the surface area mapping module 480 may process the locus of location information points to define one or more boundaries for the portion of the data center floor surface area. In some embodiments, the surface area mapping module 480 may define a portion of the data center floor surface area based on a combination of location information from the location module 470 and location information from a user of the mobile terminal 400 obtained through the user interface 490. For example, the location module 470 may identify a point in the data center floor and the user may specify that this point is the southwest corner of a region that spans 5 feet by 5 feet.

At block 515, a usage status of the portion of the floor surface area of the data center that has been defined is specified. FIG. 6 illustrates various operations for specifying the usage status of the portion of the surface area of the data center floor according to various embodiments of the inventive subject matter. Referring to FIG. 6, operations begin at block 600 where a determination is made whether the portion of the surface area of the data center floor is occupied or empty. If the portion of the surface area of the data center floor is empty, then the usage status is specified as empty as block 605. This may be done, for example, by the user through the user interface module 490 or automatically based on the scanning module not detecting any labeled or unlabeled element in the space.

If the portion of the surface area of the data center floor is occupied, then operations continue at block 610 where a determination is made whether the space is occupied with a labeled element or an unlabeled element. A labeled element may be identified at block 620 by scanning the identifier using the scanning module 485 and the specifying the usage status as containing the identified labeled element at block 625. An unlabeled element may be identified by the user through the user interface 490 and/or through the scanning module 485 being unable to detect an identifier on the object occupying the space. The portion of the surface area of the data center floor may be specified as containing an unlabeled element at block 615. The user may provide a description through the user interface 490 regarding the type of unlabeled element that occupies the space, e.g., the unlabeled element is a table, file cabinet, refrigerator, etc.

Returning to FIG. 5, operations continue at block 520 where the floor plan of the data center is updated based on the usage status specified at block 515. As described above, the floor plan may be updated locally on the mobile terminal 400 via the floor plan module and/or the mobile terminal 400 may communicate with, for example, the data processing system 200 to share the updated floor plan information so that the floor plan stored external to the mobile terminal 400 can be updated to reflect the current layout/usage of the data center floor. A data center administrator may, for example, use the usage status specification of one or more portions of the data center floor surface area to reserve the portion(s) of the data center floor surface area for a new element, to reconfigure the elements on the data center floor to more efficiently use the available space, and/or to confirm that the floor plan accurately reflects the configuration of elements that currently reside in the data center.

Some embodiments of the present invention provide a location-aware device that can be used to identify an area within a data center by, for example, walking a perimeter of the area to be identified and/or collecting various location information data points through which the boundaries of the area can be determined with and/or without additional information provided from the user. The floor plan of the data center may then be updated with the usage status of the area that has been identified/defined. This may be useful, for example, when it is desired to reserve unused or under-utilized space within the data center for new equipment, such as a customer's co-located rack. Under-utilized space may contain unlabeled elements, such as discarded furniture, storage cabinets, kitchen items (e.g., refrigerator, coffee station, etc.), and the like that may cause the space to show up as occupied on a data center floor plan, but could be put to better use. In general, the location-aware device may be used to mark new areas (e.g., empty or vacant areas that do not contain any type of element) and/or verify existing areas (e.g., specify whether they contain labeled and/or unlabeled elements) so that a data center administrator or those responsible for managing the data center can better utilize the available space.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

The corresponding structures, materials, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

What is claimed is:

1. A method comprising:
performing operations as follows on a processor of a mobile communication device located in a data center:
receiving an input, at a user interface of the mobile communication device, comprising an instruction to define a perimeter of a portion of a floor surface area of the data center as the mobile communication device traverses the perimeter;
responsive to receiving the instruction, receiving, from a positioning system in communication with the mobile communication device, a geographic reference signal at multiple locations along the perimeter as the mobile communication device traverses the perimeter wherein the geographic reference signal comprises one of a local positioning system signal and a global satellite system signal;
generating location information defining the perimeter responsive to receiving the geographic reference signal at the multiple locations;
defining a portion of the floor surface area of the data center based on the generated location information defining the perimeter and a floor plan of the data center;
receiving an input, at the user interface of the mobile communication device, comprising an instruction to specify a usage status of the defined portion of the floor surface area of the data center traversed by the mobile communication device;
determining an updated floor plan of the data center based on the usage status of the defined portion of the floor surface area; and
communicating, to an external data center management system, the updated floor plan to confirm that the floor plan of the data center reflects a configuration of elements in the data center based on the usage status of the portion of the floor surface area in the updated floor plan.

2. The method of claim 1, wherein the generated location information maps to an internal region of the portion of the floor surface area of the data center so as to define a boundary of the portion of the floor surface area.

3. The method of claim 1, wherein the generated location information maps to an external region outside of the portion of the floor surface area so as to define a boundary of the portion of the floor surface area.

4. The method of claim 1, wherein the instruction to specify the usage status of the portion of the floor surface area comprises an instruction to specify that the portion of the floor surface area is empty.

5. The method of claim 1, wherein the instruction to specify the usage status of the portion of the floor surface area comprises an instruction to specify that the portion of the floor surface area is occupied.

6. The method of claim 5,
wherein the instruction to specify that the portion of the floor surface area is occupied comprises an identifier of one or more labeled elements located in the data center.

7. The method of claim 6, the method further comprises:
scanning the identifier associated with the one or more labeled elements.

8. The method of claim 5,
wherein the instruction to specify that the portion of the floor surface area is occupied comprises information identifying one or more unlabeled elements located in the data center.

9. The method of claim 8, the method further comprises:
receiving an input from a user comprising the information identifying the one or more unlabeled elements that occupies the portion of the floor surface area.

10. The method of claim 1, wherein the local positioning system signal comprises one of a cellular signal and a Wi-Fi signal.

11. The method of claim 1, wherein the global satellite system signal comprises one of a Global Positioning System (GPS) signal, a Global Navigation Satellite System (GLONASS) signal, Galileo satellite system signal, and a BeiDou Navigation Satellite System (BDNSS) signal.

12. The method of claim 1, wherein the usage status identifies the portion of the floor surface area of the data center as reserved for an element to be added to the data center.

13. The method of claim 1, wherein generating location information defining the perimeter responsive to receiving the geographic reference signal at the multiple locations comprises determining a locus of the geographic reference signal received at the multiple locations.

14. The method of claim 1, wherein receiving, from a positioning system in communication with the mobile communication device, a geographic reference signal at multiple locations along the perimeter as the mobile communication device traverses the perimeter comprises:
activating location circuity of the mobile communication device at the start of the traversal of the perimeter; and
deactivating the location circuity of the mobile communication device at the end of the traversal of the perimeter.

15. A system, comprising:
a processor of a mobile communication device located in a data center; and
a memory coupled to the processor and comprising computer readable program code embodied in the memory that when executed by the processor causes the processor to perform operations comprising:
receiving an input, at a user interface of the mobile communication device, comprising an instruction to define a perimeter of a portion of a floor surface area of the data center as the mobile communication device traverses the perimeter;
responsive to receiving the instruction, receiving, from a positioning system in communication with the mobile communication device, a geographic reference signal at multiple locations along the perimeter as the mobile communication device traverses the perimeter, wherein the geographic reference signal comprises one of a local positioning system signal and a global satellite system signal;

generating location information defining the perimeter responsive to receiving the geographic reference signal at the multiple locations;

defining a portion of the floor surface area of the data center based on the generated location information defining the perimeter and a floor plan of the data center;

receiving an input, at the user interface of the mobile communication device, comprising an instruction to specify a usage status of the defined portion of the floor surface area of the data center traversed by the mobile communication device;

determining an updated floor plan of the data center based on the usage status of the defined portion of the floor surface area; and communicating, to an external data center management system, the updated floor plan to confirm that the floor plan of the data center reflects a configuration of elements in the data center based on the usage status of the portion of the floor surface area in the updated floor plan.

16. A computer program product, comprising:

a tangible non-transitory computer readable storage medium comprising computer readable program code embodied in the medium that when executed by a processor of a mobile communication device causes the processor to perform operations comprising:

receiving, at a user interface of the mobile communication device, an input comprising an instruction to define a perimeter of a portion of a floor surface area of a data center as the mobile communication device traverses the perimeter;

responsive to receiving the instruction, receiving, from a positioning system in communication with the mobile communication device, a geographic reference signal at multiple locations along the perimeter as the mobile communication device traverses the perimeter wherein the geographic reference signal comprises one of a local positioning system signal and a global satellite system signal;

generating location information defining the perimeter responsive to receiving the geographic reference signal at the multiple locations;

defining a portion of the floor surface area of the data center based on the generated location information defining the perimeter and a floor plan of the data center;

receiving an input, at the user interface of the mobile communication device, comprising an instruction to specify a usage status of the defined portion of the floor surface area of the data center traversed by the mobile communication device;

determining an updated floor plan of the data center based on the usage status of the defined portion of the floor surface area; and communicating, to an external data center management system, the updated floor plan to confirm that the floor plan of the data center reflects a configuration of elements in the data center based on the usage status of the portion of the floor surface area in the updated floor plan.

* * * * *